United States Patent [19]

Ishibashi et al.

[11] Patent Number: 5,218,714
[45] Date of Patent: Jun. 8, 1993

[54] CATV REPEATING AMPLIFIER CIRCUITRY

[75] Inventors: Ryouji Ishibashi; Mituo Sekiguchi, both of Tokyo, Japan

[73] Assignee: NEC Corporation, Tokyo, Japan

[21] Appl. No.: 749,305

[22] Filed: Aug. 23, 1991

[51] Int. Cl.$^5$ .................. H04H 1/02; H03F 3/26; H04N 7/00
[52] U.S. Cl. .................... 455/5.1; 455/6.1; 358/86; 330/55
[58] Field of Search .................. 455/3.1, 3.3, 4.1, 5.1, 455/6.1, 14, 15, 86; 358/86; 330/53, 54, 55, 150, 302, 310, 286, 262

[56] References Cited
U.S. PATENT DOCUMENTS

Re. 31,639  7/1984  Nicholson ............... 455/5.1
5,130,664  7/1992  Paulic et al. ............ 358/86

*Primary Examiner*—Reinhard J. Eisenzopf
*Assistant Examiner*—Lisa Charouel
*Attorney, Agent, or Firm*—Whitham & Marhoefer

[57] ABSTRACT

Bidirectional CATV (Cable Television) repeating amplifier circuitry has a first splitter, a second splitter, trunk distribution terminals used at a low level, and subscriber distribution terminals used at a high level. A distribution circuit distributes a signal from the first splitter to the distribution circuits and couples up-going signals from the distribution terminals and delivers the coupled signal to the second splitter.

3 Claims, 2 Drawing Sheets

CATV REPEATING AMPLIFIER CIRCUITRY

BACKGROUND OF THE INVENTION

The present invention relates to CATV amplifier circuitry and, more particularly, to the construction of a distribution circuit thereof.

A prerequisite with conventional CATV repeating amplifier circuitry is that two different kinds of repeating amplifiers, i.e., a trunk distributing amplifier and a trunk branching amplifier be provided on each of a trunk distribution line and a subscriber distribution line. Both of the trunk distributing amplifier and trunk branching amplifier have customarily been used at the same level on all of the distributing terminals. As a result, not all of the distributing terminals are effectively used at all times, i.e., some of them have to be subjected to terminal processing as idle terminals. This is undesirable from the cost performance standpoint.

SUMMARY OF THE INVENTION

It is, therefore, an object of the present invention to provide CATV repeating amplifier circuit capable of accommodating both of a subscriber distribution line and a trunk distribution line and, moreover, promoting the effective use of distribution terminals in a field where such two lines are often mixed together and reducing the number of repeating amplifiers to enhance the cost performance.

It is another object of the present invention to provide generally improved CATV repeating amplifier circuitry.

CATV repeating amplifier circuitry of the present invention comprises a down-going input terminal and a down-going output terminal, a first directional filter having a common terminal connecting to the down-going input terminal, a down-going main amplifier having an input terminal connecting to the high-pass side of the first directional filter, a first splitter having two output terminals and one input terminal which is connected to the output terminal of the down-going main amplifier, a second directional filter having a high-pass side connecting to one of the output terminals of the first splitter and a common terminal connecting to the down-going output terminal, a second splitter having two input terminals one of which is connected to the low-pass side of the second directional filter, an up-going main amplifier having an input terminal connecting to the output terminal of the second splitter and an output terminal connecting to the low-pass side of the first directional amplifier, a first distributing amplifier having an input terminal connecting to the other output terminal of the first splitter, at least one trunk distribution terminal to be used at a low level and at least one subscriber distribution terminal to be used at a high level, and a distributing circuit for applying the output of the first distributing amplifier to the trunk distribution terminal, applying the output to the subscriber distribution terminal after amplifying it, and applying signals from the trunk distribution terminal and subscriber distribution terminal to the other input terminal of the second splitter.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
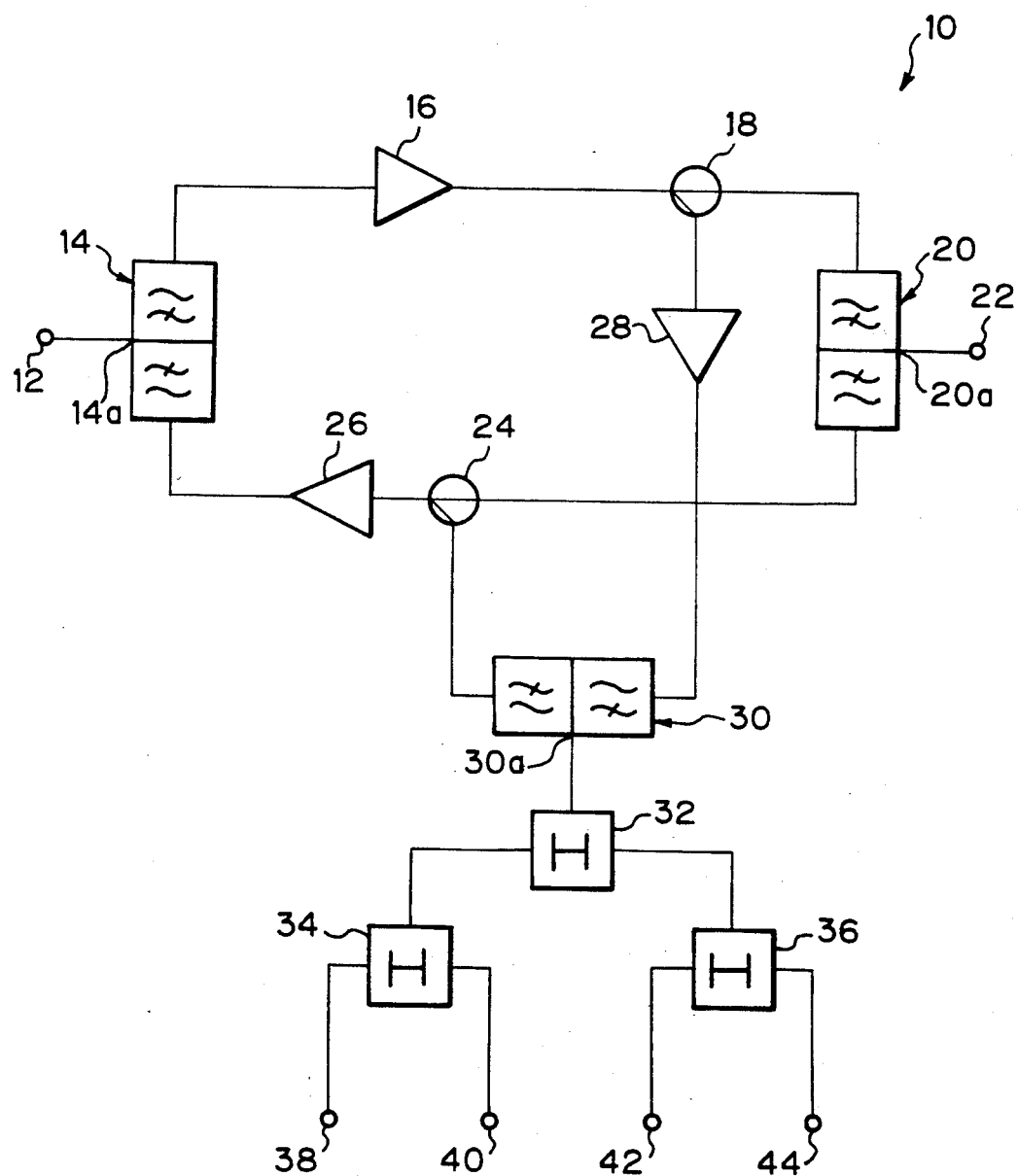
FIG. 1 is a block diagram schematically showing conventional CATV repeating amplifier circuitry.

Referring to FIG. 1 of the drawings, prior art bidirectional CATV repeating amplifier circuitry is shown and generally designated by the reference numeral 10. As shown, the amplifier circuitry 10 has a down-going input terminal 12 which also functions as a down-going output terminal. A first directional filter 14 has a common terminal 14a which is connected to the down-going input terminal 12. A down-going main amplifier 16 is connected at the input thereof to the high-pass side of the first directional filter 14. A first splitter 18 is connected at the input thereof to the output of the down-going main amplifier 16. A second directional filter 20 is connected at the high-pass side thereof to one of two output terminals of the first splitter 18 and has a common output terminal 20a. A down-going output terminal 22 which also functions as a down-going input terminal is connected to the common terminal 20a of the second directional filter 20. A second splitter 24 has one input thereof connected to the low-pass side of the second directional filter 20. An up-going main amplifier 26 is connected at the input thereof to the output of the second splitter 24 and at the output thereof to the low-pass side of the first directional filter 14. A first distributing amplifier 28 is connected at the input thereof to the other output of the first splitter 18.

A third directional filter 30 is connected at the high-pass side thereof to the output of the first distributing amplifier 28 and at the low-pass side thereof to the other input of the second splitter 24. A first hybrid transformer 32 has the input thereof connected to the common terminal 30a of the third directional filter 30 and plays the role of a first coupler. A second hybrid transformer 34 has the input thereof connected to one output of the first hybrid transformer 32 and serves as a second coupler. A third hybrid transformer 36 has the input thereof connected to the other output of the first hybrid transformer 32 and plays the role of a third coupler. Distributing terminals 38 and 40 are connected to the outputs of the second hybrid transformer 34 while distributing terminals 42 and 44 are connected to the output terminals of the third hybrid transformer 36. The third directional filter 30 and the first to third hybrid transformers 32-36 constitute in combination a distributing circuit for distributing the output of the first splitter 18 to the distributing terminals 38-44 and applying the up-going signals from the terminals 38-44 to the second splitter 24.

In operation, a signal to be distributed is routed through the first splitter 18 to the first distributing amplifier 28. The resulted output of the amplifier 28 is outputted via the high-pass side and common terminal 30a of the third directional filter 30 and then split into two by the first hybrid transformer 32. The split outputs of the first hybrid transformer 32 each is split into two by associated one of the second and third hybrid transformers 34 and 36. All the outputs of the hybrid transformers 34 and 36 are distributed via the distributing terminals 38-44 at the same level. On the other hand, up-going input signals arrived at the distributing terminals 38-44 are coupled by the second and third hybrid transformers 34 and 36 and then by the first hybrid transformer 32. The resulted output of the first hybrid transformer 32 is routed through the third directional filter 30 and second splitter 24 to the up-going main amplifier 26.

A prerequisite with the conventional repeating amplifier circuitry 10 is that two different kinds of repeating amplifiers, i.e., a trunk distributing amplifier and a trunk branching amplifier be provided on each of a trunk distribution line and a subscriber distribution line, as stated earlier. Both of the trunk distributing amplifier and trunk branching amplifier have customarily been used at the same level on all of the distributing terminals. As a result, not all of the distributing terminals are effectively used at all times, i.e., some of them have to be subjected to terminal processing as idle terminals. This is undesirable from the cost performance standpoint.

Figure 2:
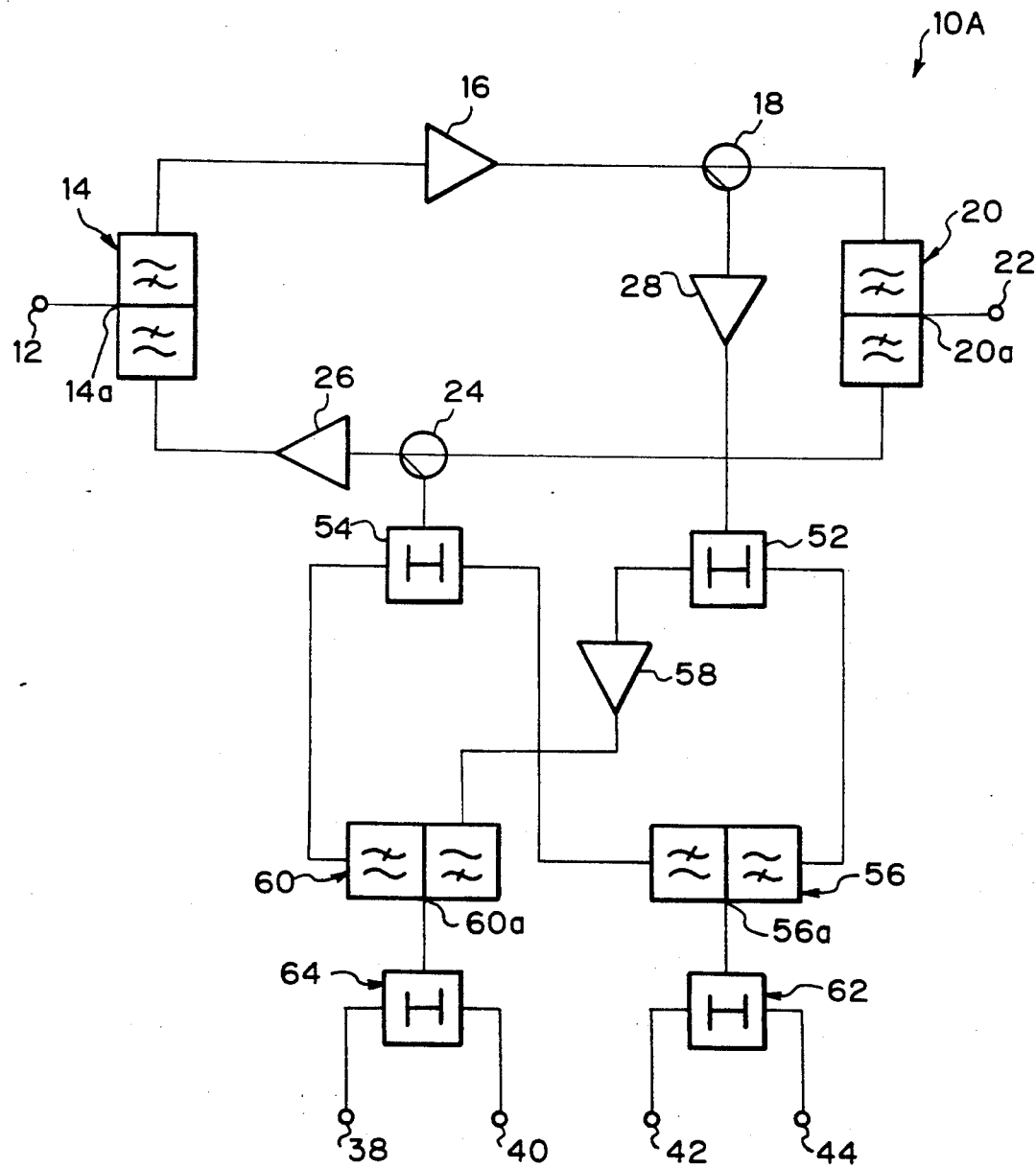
FIG. 2 is a block diagram schematically showing CATV repeating amplifier circuitry embodying the present invention.

Referring to FIG. 2, CATV repeating amplifier circuitry embodying the present invention is shown. In the figures, the same or similar components are designated by like reference numerals, and redundant description will be avoided for simplicity. As shown, the amplifier circuiry, generally 10A, is identical with the conventional amplifier 10 in that it has the down-going input terminal 12 which may function as a down-going output terminal, first directional filter 14, down-going main amplifier 16, first splitter 18, second directional filter 20, down-going output terminal 22 which may function as a down-going input terminal, second splitter 24, up-going main amplifier 26, and first distributing amplifier 28. However, the circuitry 10A has a unique arrangement for distributing the output of the first splitter 18 to the distributing terminals via the first distributing amplifier 28 and applying the up-going input signals from the distributing terminals to the second splitter 24.

The unique arrangement mentioned above includes a first hybrid transformer, or first coupler, 52 which is connected at the input thereof to the output of the first distributing amplifier 28. A second hybrid transformer, or second coupler, 54 is connected at the output thereof to the other input of the second splitter 24. A third directional filter 56 has the high-pass side thereof connected to one output of the first hybrid transformer 52 and the low-pass side thereof connected to one input of the second hybrid transformer 54. A second distributing amplifier 58 is connected at the input thereof to the other output of the first hybrid transformer 52. A fourth directional filter 60 has the high-pass side thereof connected to the output of the second distributing amplifier 58 and the low-pass side thereof connected to the other input of the second hybrid transformer 54. A third hybrid transformer, or third coupler, 62 is connected at one input/output thereof to the common terminal 56a of the third directional filter 56. Two trunk distribution terminals 42 and 44 each is connected to one of the other two input/outputs of the third hybrid transformer 62. A fourth hybrid transformer, or fourth coupler, 64 has one input/output thereof connected to the common terminal 60a of the fourth directional filter 60. Two subscriber distribution terminals 38 and 40 each is connected to one of the other two input/outputs of the fourth hybrid transformer 64.

In operation, a signal to be distributed is applied to the first distributing amplifier 28 via the first splitter 18. The resulted output of the amplifier 28 is split into two by the first hybrid transformer 52. One of the split signals is routed through the high-pass side of the third directional filter 56 and common terminal 56a to the third hybrid transformer 62 to be split again. The two output signals of the third hybrid transformer 62 each is sent out via one of the two trunk distribution terminals 42 and 44 at the trunk distribution level. The other output signal of the hybrid transformer 52 is amplified by the second distributing amplifier 58 and then routed to the fourth hybrid transformer 64 via the high-pass side and common terminal 60a of the fourth directional filter 60. Then, the transformer 64 again splits the output signal of the directional filter 60. The split output signals of the transformer 64 are sent out to the subscriber line as the subscriber level which is higher than the trunk level via the subscriber distribution terminals 38 and 40. The second distributing amplifier 58 may be implemented as a power doubling or similar low distortion, high performance amplifier since the output at the last stage associated therewith is a high level output.

Up-going input signals from the distribution terminals 38-44 are coupled by the hybrid transformers 62 and 64 and then coupled by the hybrid transformer 54 via the low-pass sides of the third and fourth directional filters 56 and 60. The resulted output signal of the transformer 54 is applied to the up-going main amplifier 26 via the second splitter 24.

As stated above, the illustrative embodiment assigns the subscriber level distributing function to two distributing terminals 38 and 40 and the trunk level distributing function to the other two distributing terminals 42 and 44. It is to be noted that each directional filter included in the circuitry 10A has a frequency of 70 megahertz for down-going signals and 50 megahertz for up-going signals.

In summary, it will be seen that the present invention provides CATV repeating amplifier circuitry which accommodates both of a subscriber distribution line and a trunk distribution line. The amplifier, therefore, not only promotes the effective use of distribution terminals in a field where the two lines are often mixed together, but also reduces the required number of repeating amplifiers, thereby enhancing cost-effective operations.

Various modifications will become possible for those skilled in the art after receiving the teachings of the present disclosure without departing from the scope thereof.

What is claimed is:

1. A CATV repeating amplifier circuitry comprising:
   down-going input terminal means and a down-going output terminal means;
   first directional filter means having a common terminal connecting to said down-going input terminal means;
   down-going main amplifier means having an input terminal connecting to a high-pass side of said first directional filter means;
   first splitter means having two output terminals and one input terminal which is connected to an output terminal of said down-going main amplifier means;
   second directional filter means having a high-pass side connecting to one of said output terminals of said first splitter means and a common terminal connecting to said down-going output terminal means;
   second splitter means having two input terminals one of which is connected to a low-pass side of said second directional filter means;

up-going main amplifier means having an input terminal connecting to an output terminal of said second splitter means and an output terminal connecting to a low-pass side of said first directional amplifier means;

first distributing amplifier means having an input terminal connecting to the other output terminal of said first splitter means;

at least one trunk distribution terminal means to be used at a low level and at least one subscriber distribution terminal means to be used at a high level; and distributing means for applying an output of said first distributing amplifier means to said trunk distribution terminal means, applying an output to said subscriber distribution terminal means after amplifying said output, and applying signals from said trunk distribution terminal means and said subscriber distribution terminal means to the other input terminal of said second splitter means.

2. A circuitry as claimed in claim 1, wherein said trunk distribution terminal means and said subscriber distribution terminal means each comprises two terminals.

3. A circuitry as claimed in claim 2, wherein said distributing means comprises:

first coupler means having two output terminals and one input terminal which is connected to the output terminal of said first distributing amplifier means;

second coupler means having two input terminals and one output terminal which is connected to the output terminal of said second splitter means;

third directional filter means having a high-pass side connecting to one of said output terminals of said first coupler means, a low-pass side connecting to one of said input terminals of said second coupler means, and a common terminal;

second distributing amplifier means having an input terminal connecting to the other output terminal of said first coupler means;

fourth directional filter means having a high-pass side connecting to an output terminal of said second distributing amplifier means, a low-pass side connecting to the other input terminal of said second coupler means, and a common terminal;

third coupler means having an input/output terminal connecting to said common terminal of said third directional filter means, and two input/output terminals each connecting to one of two terminals of said trunk distribution terminal means; and fourth coupler means having an input/output terminal connecting to said common terminal of said fourth directional filter means, and two input/output terminals each connecting to one of two terminals of said subscriber distribution terminal means.

* * * * *